United States Patent [19]
Pfaff

[11] Patent Number: 6,016,254
[45] Date of Patent: Jan. 18, 2000

[54] MOUNTING APPARATUS FOR GRID ARRAY PACKAGES

[76] Inventor: Wayne K. Pfaff, 309 Steeplechase, Irving, Tex. 75062

[21] Appl. No.: 08/680,170

[22] Filed: Jul. 15, 1996

[51] Int. Cl.[7] .................................................. H05K 07/12
[52] U.S. Cl. .......................... 361/769; 361/760; 361/767; 361/772; 361/774; 439/71; 257/692; 257/697; 257/726; 257/727
[58] Field of Search ..................................... 361/769, 767, 361/768, 772, 774, 766; 439/68, 71, 74, 73, 330, 326; 257/692, 697, 726, 727

[56] References Cited

U.S. PATENT DOCUMENTS

| | | | |
|---|---|---|---|
| 3,820,054 | 6/1974 | Clewes et al. | 439/73 |
| 4,222,622 | 9/1980 | Griffin et al. | 439/71 |
| 5,437,556 | 8/1995 | Bargain et al. | 439/66 |

*Primary Examiner*—Leo P. Picard
*Assistant Examiner*—David Foster
*Attorney, Agent, or Firm*—Jack A. Kanz

[57] ABSTRACT

Grid array device packages are mounted on a circuit board or other substrate with a socket having a base member, a retaining member and an array of bent contact pins. The ends of the contact pins are displaced by insertion of a device package and then respond with a small spring force to hold the device package in place against ledges on the retaining member. The contact ends of the pins make electrical connection with terminals on the device package. A sufficient portion of each pin is implanted within the base member to prevent stress from passing through the base member. The retaining member leaves a significant portion of the upper surface of the device package exposed so that packages with attached heat sinks may be mounted therein.

58 Claims, 4 Drawing Sheets

MOUNTING APPARATUS FOR GRID ARRAY PACKAGES

This invention relates to sockets for microelectronic device packages. More particularly, it relates to apparatus for removeably mounting grid array packages on circuit boards or similar substrates which permits mounting of packages with heat sinks secured thereto and which eliminates transmission of stress from the contact end of the contact pin to the interconnection between the contact pin and the substrate.

BACKGROUND OF THE INVENTION

Advances in microelectronics technology tend to produce circuit chips which occupy less space while performing more functions. As the number of electrical interconnections between the chip and external circuitry required for the circuit in the chip to communicate with the outside world increases, the physical size of each such interconnection must decrease. In order to provide electrical communication between the circuit chip and external circuitry, circuit chips are usually contained within a housing or package which supports interconnection leads, pads, lands, etc., on one or more of its external surfaces. In order to reduce overall lead length from chip to external circuitry and to provide adequate spacing between input/output terminals on the package, high pin count devices are usually contained in packages with input/output terminals arranged in a grid pattern on one face of the package. The terminals may be in the form of pins extending from the package (usually described as a pin grid array or PGA) or contact pads or lands on the surface of the package (usually described as a land grid array or LGA). To physically attach the package to a substrate and provide electrical communication between its terminal lands and similar interconnect pads on the surface of a substrate such as a circuit board or the like, a small drop or ball of solder or the like is secured to each terminal land on the device package. Since the solder drop forms a ball-like protrusion extending from the terminal land, such devices are ordinarily described as ball grid array (BGA) device packages. Conversely, solder bumps may be formed on the interconnect pads or lands on the substrate which then mate with the lands on the LGA.

By aligning the lands or solder balls with corresponding interconnect pads or solder bumps on the surface of the board, grid array device packages may be electrically connected and structurally fastened to the circuit board surface without the need for pins or holes in the circuit board. This permits mounting circuit devices on both sides of the circuit board as well as increasing the density of device packages on the board. While use of less space is a great benefit, directly attaching the package to the circuit board creates some problems, particularly if the package must later be removed. Sockets attached to the surface of the board to receive the device packages and hold them in appropriate electrical contact while permitting removal and replacement are therefore desireable in many applications.

It is also very difficult to test BGA packages because of the difficulty in repeatedly making reliable electrical contact with the solder ball which forms the terminal without damaging the terminal ball. Since the terminal ball is solder, contact pins forced against the terminal tend to deform the ball or become bonded thereto by migration of the solder around the contact pin.

Reduction in size combined with more circuit functions necessarily results in generation of more heat in less space and thus less ability to dissipate that heat. As a result, it is frequently necessary to use heat sinks attached to the device packages to dissipate heat generated by the circuit chip. Unfortunately, prior art sockets (both for end use and for test purposes) generally employ a hinged cover or lid to hold the package in place. Such covers, however, interfere with and thus preclude mounting of device packages with attached heat sinks and, because of the stresses applied, may warp the socket base and thus damage the connections between the mounting socket and the substrate.

SUMMARY OF THE INVENTION

The present invention provides mounting apparatus for grid array device packages in the form of a socket which is permanently affixed to the circuit board. Relatively short pins within the socket provide electrical communication between the lands, pads or terminal balls on the package and the circuit board so that the sockets can be used to mount high frequency devices. The contact pins are secured in holes in the base of the apparatus with a significant portion of the total length of each pin confined within the base member so that forces associated with insertion into, removal from or maintaining the package in the socket is exerted only against and confined to the base member and not transmitted through the pins to the circuit board. The contact pins (in one embodiment) also urge the package upwardly against retaining members in the socket to hold the package in place but still allow insertion and removal by the exertion of small forces on the package. The retaining members leave the majority of the top face of the chip package uncovered and available either for convective heat transfer or, more preferably, conductive heat transfer through heat sinks. Alternatively, the socket may include retaining ledges or stops which limit the depth of insertion (and therefore the pressure exerted against the pins) into the socket. In this arrangement the entire top face of the socket is open and the device packages are held in place by the weight of the heat sink or other retaining means which accommodates the heat sink.

The mounting apparatus of the invention may be used is as an end use socket or as a test and burn-in socket and may be designed for use with LGA or BGA packages. Other features and advantages of the invention will become more readily understood from the following detailed description taken in connection with the appended claims and attached drawing in which:

DESCRIPTION OF THE PREFERRED EMBODIMENTS

In the following description the terms "mounting apparatus" and "socket" are used interchangeably to represent apparatus for removeably mounting a device package on a substrate such as a circuit board or the like. The terms "chip", "device" and "package" are used interchangeably, both singly and in various combinations, to describe a device package or an unpackaged circuit chip which has terminal lands or terminal balls on one face for providing electrical contact to the circuit chip and supporting the package on a substrate. The term "grid array device package" may, therefore, be used to describe a ball grid array package, a land grid array package or a bare chip with terminal lands or terminal balls.

Figure 1:
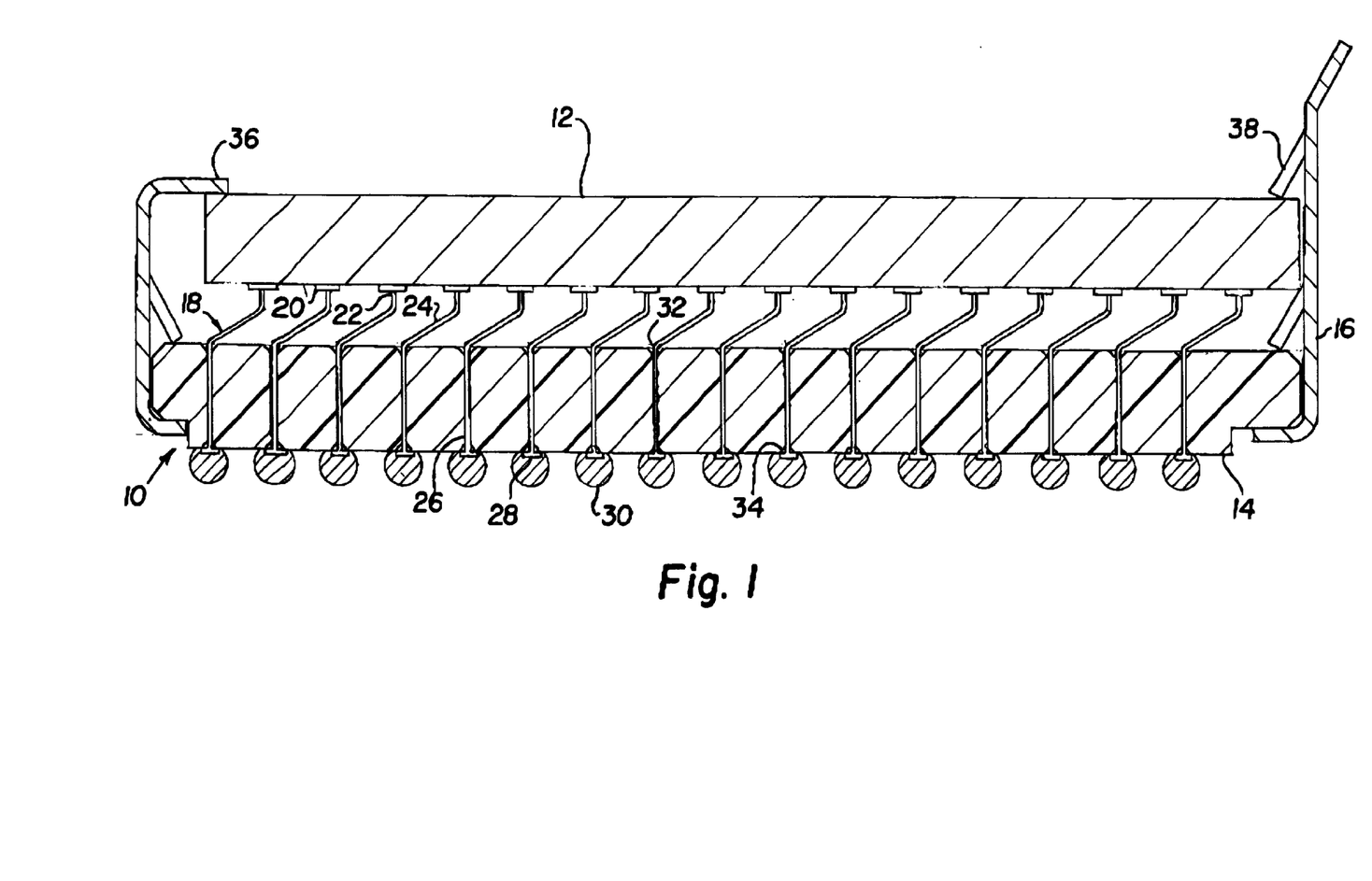
FIG. 1 is a sectional view of a preferred embodiment of the invention with a device package in place in the mounting apparatus.

FIG. 1 illustrates one embodiment of the invention with a package 12 mounted therein. The socket 10 comprises three major components. The base member 14 acts as support structure for the apparatus. Retaining member 16 retains the package 12 in place as well as guiding it to the proper location. Contact pins 18 electrically interconnect the lands 20 on the package 12 with circuitry on a circuit board or other substrate.

As illustrated in FIG. 1 the contact pins 18 provide force against the lands on package 12 and urge it against ledges 36 and 38 of the retaining member 16. The contacts pins 18 are resilient so that package 12 may be removed or inserted by pushing against the exposed upper surface to bend pins 18. The package 12 is then slipped past the ledges 36 and 38 and removed or, alternatively, re-inserted. The package 12 is preferably inserted by placing the left end (as shown in FIG. 1) below ledge 36 and then pushing the right end down directly against the contact pins 18. The package 12 is then moved to the right and under ledge 38. The contact pins 18 urge the package 12 upwardly against the ledges and retain it in the proper position. This insertion process causes the contact ends 22 of the contact pins 18 to scrape against the lands 20 and form a clean connection.

As shown in FIG. 1, contact pins 18 comprise a contact end 22 (which contacts the lands 20 on the package 12), a head 28 on the interconnect side of the base member 14 (which contacts a solder ball 30), and an intermediate portion connecting the ends. Although the preferred embodiment employs a head 28, the head is not required. Instead, the interconnection end may either be a straight end or other configuration which provides adequate electrical contact and physical support.

The intermediate portion of contact pin 18 is comprised of a free portion 24 and an implanted portion 26. The free portion 24 bends to accommodate insertion and removal of the package 12.

The contact pins 18, which are resilient enough to respond to pressure on package 12 and move to accommodate its insertion or removal, apply sufficient force to maintain package 12 against retaining member 16 when external force is removed. The force applied by contact pins 18 must also be sufficient to overcome not only the weight of package 12 but also the weight of any heat sink or other item attached to the exposed face of package 12.

In the embodiment of FIG. 1, the entire top face of package 12 (except for the peripheral portions trapped under ledges 36, 38) is uncovered and exposed, leave as much as ninety-five percent (95%) or more of the top face for interconnection with a heat-dissipating device such as a heat sink or the like. The heat sink may be secured to the exposed face or merely placed thereon and held in place by gravity. Alternatively, the heat sink may be secured in place by other means such as clamps, bolts, hooks, hinges, etc., extending through the substrate, its mounting chassis or the socket structure itself.

Figure 4:
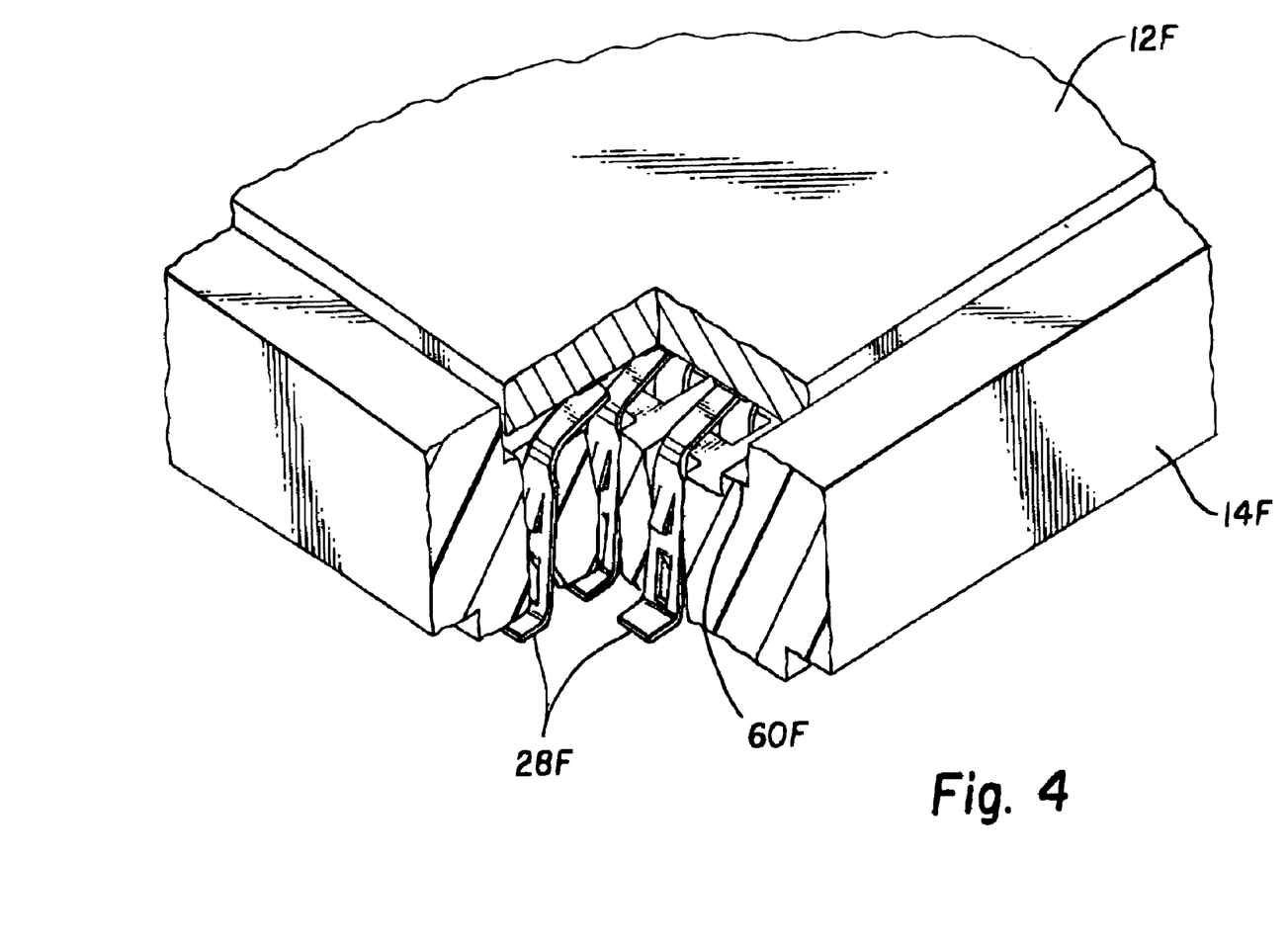
FIG. 4 is a perspective view, partially in section, illustrating an alternative embodiment of the socket of the invention.

In the alternative embodiment illustrated in FIG. 4, the entire top face of the socket is uncovered. The base member 14F, however, includes a ledge 60F which supports the edges of package 12F and limits the depth of insertion into the socket. In this embodiment, the package 12F is inserted directly into the socket. Before insertion, the contact ends 22F define a plane substantially parallel with the base member 14F and below the plane defined by the top face of the contact side of the socket. The sides of the base member 14F (between the plane defined by ledges 60F and the plane defined by the top face of the socket) act to guide and hold the package to and within the proper position. Thus, when the package 12F is initially placed in the socket, the contact pins are slightly bent and the ends of the contacts scrape against the lands to provide good electrical connection. In this embodiment the package 12F is restrained from movement in any direction except vertical and its insertion depth is limited by ledge 60F. However, the entire top face of the package 12F is exposed. The package thus may be held in place by its own weight, the weight of a heat sink placed thereon or secured thereto, or other entrapment means.

Since the embodiments of FIG. 1 and FIG. 4 leave all or substantially all the top face of the package exposed, they are referred to as open top sockets as contrasted to conventional lidded or covered sockets which rely on a lid or cover hinged to the socket to hold the package in place. Nevertheless, sockets made in accordance with the invention may employ lids, covers or other closure means designed to accommodate heat sinks (or act as heat sinks) placed on or secured to the exposed face of the device packages. Such lids or covers may be attached to, hinged from or otherwise supported by the substrate, the chassis supporting the substrate or any other structure (including the body of the socket) in such a manner so as to avoid imparting stress to the base of the socket which would warp the base or otherwise adversely affect the physical or electrical attachment of the socket to the substrate.

As best illustrated in FIG. 1, a significant portion of the contact pin 18 is implanted within the base member 14 so that stresses applied to the free portion 24 during insertion and/or removal of package 12 are substantially prevented from being transmitted to the head 28 on the interconnect side of base member 14. This reduces the danger of bending the base member 14 or breaking electrical contact between the head 28 and the substrate. Careful control of tolerances and position of the solder balls or heads 30 or 28 is needed to ensure proper mating with corresponding interconnect pads on the substrate to which the socket 10 is to be attached.

Figure 5:
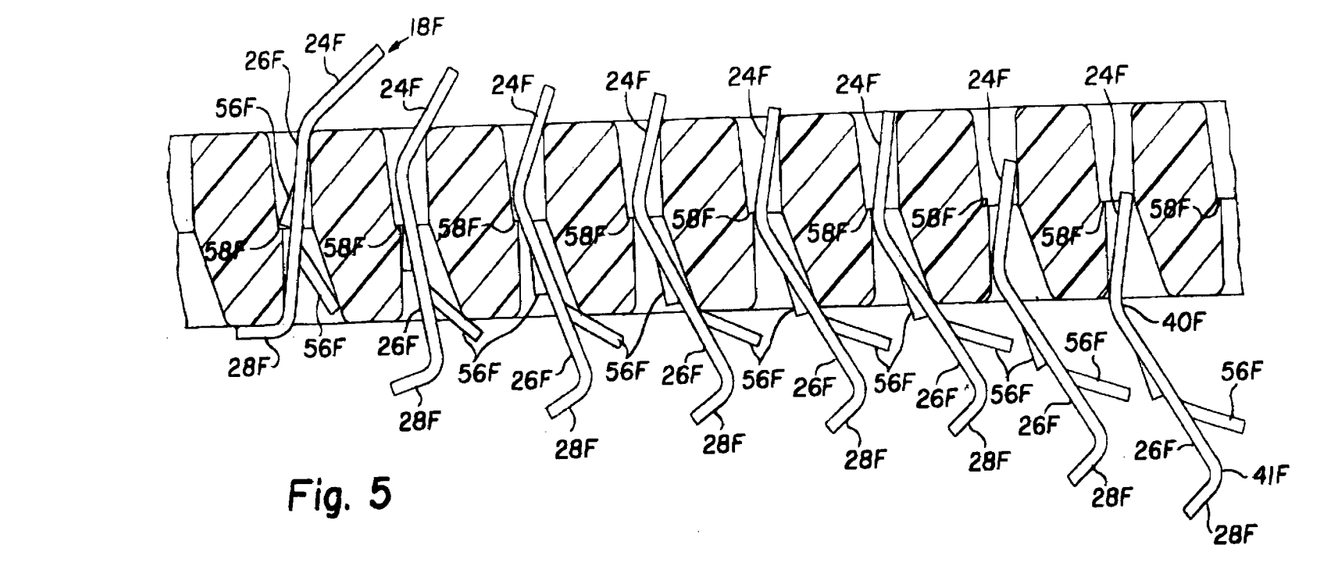
FIG. 5 is a sectional view of the base member of the embodiment of FIG. 4 illustrating insertion of the contact pins in sequential series.
Figure 6:
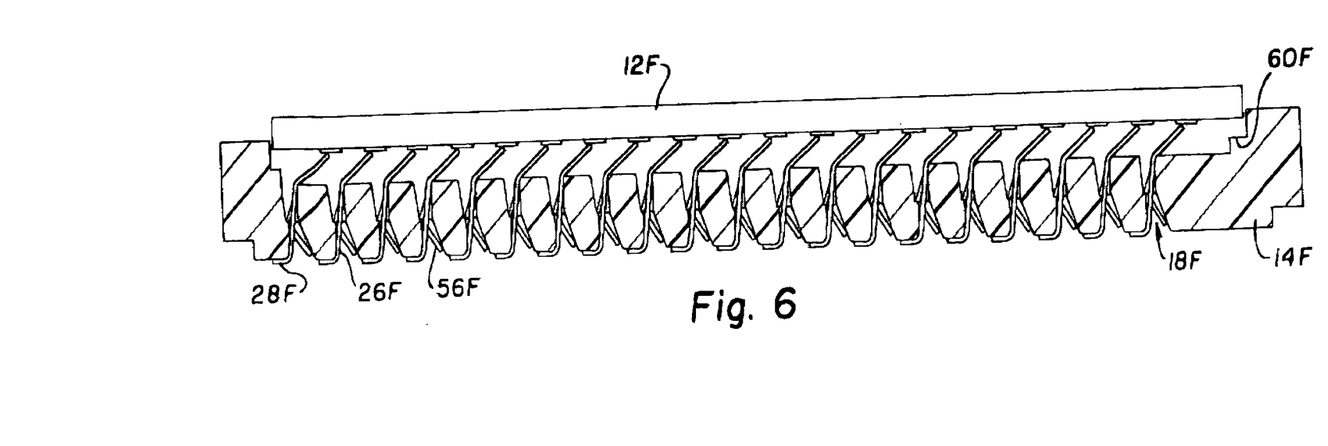
FIG. 6 is a sectional view of the socket of FIG. 5 with a device package in place.

In the embodiment illustrated in FIGS. 5 and 6 the contact pins terminate in solder tails 28F which are uniformly bent to lie adjacent the face of the base 14F and thus present a face for attachment to a circuit board or the like.

In the embodiment of FIG. 1 the contact side of the base member 14 has beveled openings 32 around the contacts 18. The bevels 32 spread the stress forces of the bending action over a broader surface area at the bend location in order to avoid catastrophic failure of the contacts 18 at the bend point during insertion or removal of the chip 12. Bevels 34 on the interconnect side of base member 14 assist in simplifying insertion of contact pins 18 into support member 14. The bevels also help retain the heads 28 of contacts 18 in position. The bevels 34 also provide better connection with the solder balls 30 by providing space behind the heads 28 to permit encapsulation of the head. Bevels 32 and 34 could have alternative profiles which provide broader diameter and/or different shapes of the primary aperture through the base member 14.

Figures 2, 3:
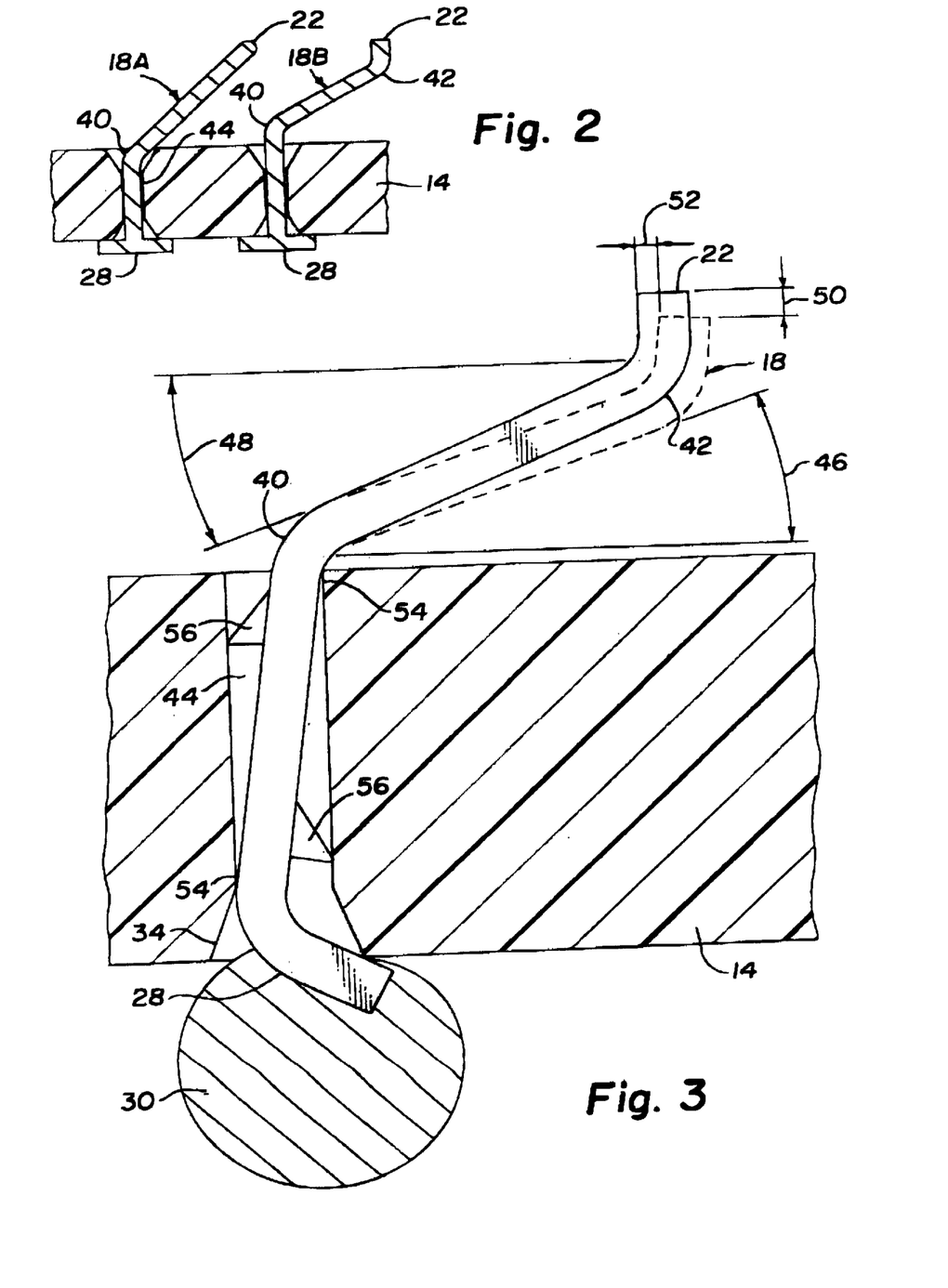
FIG. 2 is a partial sectional view of the base of the apparatus of FIG. 1 illustrating two possible configurations of contact pins.
FIG. 3 is a detailed schematic illustrating force interactions and angles involved between the contact pins and the base member.

FIG. 2 illustrates two different embodiments of contact pin 18. The base member 14 (as illustrated FIG. 2) has pre-drilled holes or apertures 44 through which contact pins 18 are inserted. In order to maximize surface engagement between contact pins 18 and the base member 14 within the holes 44, it is preferable that the diameters of the pre-drilled holes (or pre-created apertures) 44 be approximately the same as or less than the ribbon stock profiles or diameters of contact pins 18. The holes 44 need not be circular in cross-section but should have a smaller profile area or approximately the same profile area as the contact pins 18.

Contact pin 18A of FIG. 2 has a primary bend 40 which effectively defines the boundary between the free portion of the contact pin and the implanted portion. Contact pin 18B includes the boundary-defining bend 40 and a secondary bend 42. The secondary bend 42 positions the contact end 22 of the contact pin 18B at an angle substantially perpendicular to the plane of package 12, thus presenting a greater degree of surface area for physical contact between the land and the contact pin.

The configuration of contact pin 18B can be conveniently created during assembly of the socket 10. Contact pins 18 are preferably driven through apertures 44 in a substantially straight configuration. A bending plate having slots or indentations corresponding to the positions of the contacts is then placed on the ends of the contact pins with corresponding contacts each falling within a slot in the bending plate. The plate is then pushed down and moved toward the side, bending all the contact pins simultaneously and to the same degree while maintaining the spacing of contact ends 22 in a pre-defined pattern. In order to bend the contact pins while holding the contact ends 22 in pattern, the indentations must be deep enough to hold the contact ends 22 in place. This provides a primary bend 40 and a secondary bend 42 at the point where the pin first emerges from the indentations or slots of the bending plate.

FIG. 3 illustrates the interaction of contact pin 18 with the base member 14 during insertion of a package 12. The primary bend 40 defines an angle with respect to the base member 14. The thickness of the package 12 (which is positioned between the contact ends 22 and the retaining ledges 36, 38) determines the vertical displacement 50 of the contact pins 18 on insertion. The force exerted on the lands by the contact pin 18 (which results in holding the package 12 in place against the ledges 36, 38) is proportional to the angle of displacement 46 from the relaxed position of the contact pin. Since the thickness of every package may not be the same, the angle 46 must be large enough to compensate for various thicknesses and still provide adequate room for the package 12 to fit between the contact ends 22 and the ledges 36, 38. At the same time, when a package is of minimum thickness within the range of its tolerance (and thus minimum vertical displacement 50), there must be sufficient angular displacement based on that vertical displacement to provide an appropriate responsive force (typically approximately one ounce) to hold the package 12 in place and ensure electrical contact. Since only a certain relatively small distance is desired between the contact ends 22 and the retaining ledges 36, 38 when the contact pins are relaxed, and since the height of the retaining ledges 36, 38 from the base member 14 is fixed for a given configuration, the height from the contact ends 22 to the base 14 is fixed for a given configuration. Thus, if the angle 46 between the contact pin 18 and the base 14 is reduced, the pin must be correspondingly longer to reach the preferred height. Since a change in the initial angle results in a change in the length of contact pin used, at larger initial angles 46 there is a greater angular displacement for a corresponding vertical displacement 50. Larger initial angles thus result in a greater force created in response to a minimum displacement. At the same time, there must be adequate room at maximum displacement for the bending needed to accommodate insertion of all the components into proper position. This vertical displacement 50 affects the force applied by the contact pin 18 to the base 14 and, potentially, to the interconnection with the head. A greater displacement 50 results in a greater force while a smaller displacement results in a correspondingly smaller force. The displacement 50 is a function of the thickness of the portion of the package which rests between the contact ends 22 and the ledges 36 and 38 of the retaining member 16.

In addition to the vertical displacement 50 there is also a lateral displacement 52 during bending. The initial angle 46 of the contact pin 18 determines lateral displacement 52 in response to corresponding vertical displacement 50 in large part because the choice of initial angle controls the length of pin used to reach the preferred initial height of contact ends 22. The initial angle 46 should be small enough to minimize displacement 52 so that contact ends 22 do not slide off lands 20. Factors affecting this will include the width of the contact ends 22 and the widths of the lands 20. As a result, angle 46 is preferably between about 15° and about 65° with respect to the contact side of the base member 14.

Secondary bend 42 should define an angle 48 which is substantially equal to angle 46 so that contact end 22 is perpendicular to the face of the lands on an inserted package 12. Substantially equal angles automatically results from use of the above-described method of creating the bends.

During insertion and removal of the package, stress is placed on the free portion of the contact pin 18 resulting in stress at bending point 40 of contact pin 18. By implanting at least about 25% (and preferably as much as 60% or more) of the total length of contact pin 18 within base member 14, it is possible to substantially eliminate transmission of stresses exerted on the contact end to the interconnect side of base member 14. This is accomplished in large part by creating a high degree of surface engagement 54 between the implanted portion of the contact pin 18 and the internal walls of aperture 44.

FIG. 3 provides an exaggerated illustration of the space which may be created within aperture 44 by the forces and strains occurring with respect to contact 18. The great degree of surface area 54 in contact with base member 14 spreads the resulting stresses over a greater area which, in turn, reduces the stresses transmitted to the interconnection end 28.

The embodiment of FIG. 3 has no bevel in aperture 44 on the contact side of base member 14. By providing a right angle for contact with contact 18 at bending point 40, there is no significant non-vertical surface to allow transmission of a vertically upward force component against contact pin 18. In other words, the normal force reaction of the aperture wall against the bending moment will be restricted to the horizontal plane. The reduction of potential upward forces on the contact reduces the need for a corresponding force to be applied by the head 28 or solder ball 30 against the underside or interconnect side of the base member 14. Reduction of those forces required to balance the vertical force and those required to counteract the bending moment, both created on the contact side of base member 14, maintains the position of head 28 and solder ball 30 fixed with respect to the substrate on which the socket is mounted.

In addition to surface contact areas 54, projections 56 extending from contact pin 18 can be used to transmit forces to base member 14. Other means for implanting contacts 18 in base member 14 to distribute and dissipate forces from the contact pins 18 into the base member 14 are also contemplated. For example, if apertures 44 are oversized with respect to pins 18, filler material such as flowable metal, plastic or binder materials may be used to firmly implant the contact pins 18 in the base and insure adequate force distribution.

FIG. 5 illustrates (in a sequential fashion) the orientation and installation of contact pins 18F. The pins illustrated in FIG. 5 use spurs or tabs 56F projecting from the implanted portion to assist in holding the contact in place and in reducing transmission of stress to the solder tails 28F on the interconnect end. The contact pins 18F are preferably made from ribbon stock which may be economically produced and processed in large quantities. The spurs 56F are preferably punched out portions of the ribbon stock (as may be more clearly seen in FIG. 4) which remain integrally connected with the contacts 18F. Although only one spur or more than two spurs could be used, the illustrated embodiment uses two spurs 56F which project from opposite sides of the implanted portion 26F. The spurs 56F provide additional points of contact with the inner wall surfaces of the apertures in the base member 14F and provide balancing forces to those being imposed by the package.

The apertures in the embodiment shown in FIG. 5 have a profile designed to interact with the spurred contacts 18F. Specifically, a ledge 58F formed within the aperture interacts with upper spur 56F to provide a vertical counterforce to the downward forces imposed by the package. The pre-formed contacts (with the spurs 56F and bends 40F and 41F) may be inserted into the apertures in the base member 14F by a "snap-in" method. As the contacts 18F are inserted, the upper spur 56F resiliently bends until it slips past the ledge 58F. It then snaps back into its pre-formed position, holding the contact 18F from retreating from the bottom of the aperture. Lower spur 56F fills the gap in the lower half of the aperture, keeping the solder tail 28F secured against one side of the aperture and the lower face of the base member.

The solder tail 28F is preferably plated with tin/lead solder below bend 41F. Bend 41F positions solder tail 28F parallel with and adjacent the interconnect side of base member 14F. Positioning the solder tail 28F flat against the base member assists in precision of placement of the interconnections on the base of the array and also provides a good degree of surface area for contact with the aperture wall opposite lower spur 56F.

It will be appreciated that the materials used for manufacture of the mounting apparatus of the invention may be varied as desired, depending on the application. Similarly, the physical size and shape of components may be arranged to accommodate any particular grid array device package. The lengths of the contact pins may likewise be varied to accommodate different chip thicknesses. The contact pins may be gold-plated bent wires or, more preferably, ribbon stock with gold plating or the like on the contact end and tin/lead plating on the interconnect end to obtain the best contact and resilience properties. Various other material combinations are possible.

By using relatively short contact pins to directly interconnect the package lands with circuit board pads, the socket of the invention may be used for mounting high frequency devices. The general design of the socket of the invention permits fabrication of very inexpensive yet reliable sockets for end use. However, the principles of the invention lend themselves equally to use in repetitive operation as in test and burn-in board applications. Since the sockets of the invention are designed to interconnect with lands on the face of the package, such sockets may be used for burn-in and test of ball grid array packages before the ball is formed on the package land, thereby obviating many difficulties associated with testing of BGA packages.

From the foregoing it will be recognized that the principles of the invention may be employed in various arrangements to obtain the benefits of the many advantages and features disclosed. Although various configurations have been described in connection with various embodiments of sockets employing the invention (such as the use of spurs and other configurational and structural aspects of the contacts), the combinations disclosed are exemplary only. It is to be understood, therefore, that even though many characteristics and advantages of the invention have been set forth together with details of the structure and function of the invention, this disclosure is to be considered illustrative. Various changes and modifications may be made in detail, especially in matters of size, shape and arrangements of parts, without departing from spirit and scope of the invention as defined by the appended claims.

What is claimed:

1. Apparatus for mounting a grid array device package comprising:

(a) a top opening for insertion of a device package thereinto;

(b) a base member having a contact side and an interconnection side;

(c) a retaining member having a face substantially parallel with and spaced from the contact side of said base member; and (d) a plurality of elongated contact pins supported in said base member, each pin having a contact end, an interconnection end, an intermediate portion extending between said contact end and said interconnection end with said contact end extending from said contact side of said base member, at least one bend in said intermediate portion between said contact end and said contact side, and the contact end of each pin arranged to terminate in a plane substantially parallel with and spaced from the contact side of said base member.

2. Apparatus as defined in claim 1 wherein said retaining member leaves at least about 75% of one major face of a grid array device mounted therein uncovered and exposed through said top opening.

3. Apparatus as defined in claim 1 wherein said bend in said intermediate portion of each contact pin defines an angle greater than 15° and less than 65° with respect to said contact side of said base member.

4. Apparatus as defined in claim 1 wherein said bend in said intermediate portion defines an angle with respect to said contact side of said base member small enough to prevent the contact pin from sliding off the land it contacts when moving to accommodate mounting of a grid array device package therein.

5. Apparatus as defined in claim 1 wherein said bend in said intermediate portion defines an angle with respect to said contact side of said base member large enough to compensate for various thicknesses of grid array device packages while still providing the minimum force required to retain a grid array package against said retaining member.

6. Apparatus as defined in claim 1 wherein said bend in said intermediate portion constitutes the primary bend and said intermediate portion of each contact pin has a secondary bend between said primary bend and said contact end which defines an angle approximately equal to the angle of said primary bend.

7. Apparatus as defined in claim 1 wherein the length of the intermediate portion contained within said base member is at least about 25% of the total length of said contact pin.

8. Apparatus as defined in claim 1 wherein said interconnect end of each contact pin has an enlarged head.

9. Apparatus as defined in claim 1 wherein said interconnect end of each contact pin further consists of a solder ball.

10. Apparatus as defined in claim 1 wherein said contact pins pass through corresponding pre-formed apertures in said base member which are initially approximately the same size as or smaller than said contact pins prior to insertion of said pins therein.

11. Apparatus as defined in claim 10 wherein said apertures have beveled entrances on the interconnect side of said base member.

12. Apparatus as defined in claim 10 wherein said apertures have entrances on the interconnection side which are not simple right angles of the same profile size as the primary portion of the apertures passing through said base member.

13. Apparatus defined in claim 1 wherein said face of said retaining member is positioned between said contact side of the base member and the top opening of the mounting apparatus to limit the depth of insertion of a device package into said apparatus.

14. Apparatus as defined in claim 10 wherein said apertures have beveled exits on said contact side of the base member.

15. Apparatus as defined in claim 10 wherein said apertures have an exit on said contact side which has a profile different from the primary portion of the aperture passing through said base member.

16. Apparatus for mounting a grid array device package comprising:
   (a) a base member having a contact side and a interconnection side;
   (b) a retaining member for fixing a grid array device package at a predetermined position with respect to the contact side of said base member; and
   (c) an array of elongated contact pins passing through said base member, said pins having contact ends for contacting the terminals of a grid array device package mounted therein, interconnect ends for providing interconnection points on the interconnection side of said base member, and angled intermediate portions, the dimensions and angles of said pins being such that the contact ends frictionally engage the terminals and urge the grid array device package against said retaining member.

17. Apparatus as defined in claim 16 wherein said retaining member leaves uncovered at least about 75% of one major face of a grid array device package mounted therein.

18. Apparatus as defined in claim 16 wherein said bend defines an angle greater than about 15° and less than about 65° with respect to said contact side of said base member.

19. Apparatus as defined in claim 16 wherein said bend defines an angle with respect to said contact side of said base member small enough to prevent said contact pin from sliding off the terminal it contacts when moving to accommodate mounting of a grid array device package therein.

20. Apparatus as defined in claim 16 wherein said bend defines an angle large enough to compensate for various thicknesses of grid array device packages while still providing the minimum force required to retain the grid array device package against the retaining member.

21. Apparatus as defined in claim 16 wherein said bend in said intermediate portion constitutes the primary bend and the intermediate portion of each contact pin has a secondary bend between said primary bend and said contact end, the angle of which is approximately equal to the angle of said primary bend.

22. Apparatus as defined in claim 16 wherein the length of the intermediate portion contained within said base member is at least 25% of the total length of the contact pin.

23. Apparatus as defined in claim 16 wherein said interconnect end of each contact pin has an enlarged head.

24. Apparatus as defined in claim 16 wherein said interconnect end of each contact pin further consists of a solder ball.

25. Apparatus as defined in claim 16 wherein said array of contact pins passes through corresponding pre-formed apertures in said base member which are initially approximately the same size as or smaller than said contact pins prior to insertion of the contact pins therein.

26. Apparatus as defined in claim 25 wherein said apertures have beveled entrances on said interconnection side of said base member.

27. Apparatus as defined in claim 25 wherein said apertures have entrances on said interconnection side which are not simple right angles of the same profile size as the primary portion of said apertures.

28. Apparatus as defined in claim 25 wherein said apertures have beveled exits on said contact side of said base member.

29. Apparatus as defined in claim 25 wherein said apertures have an exit on said contact side which has a profile different from the primary portion of the aperture passing through said base member.

30. Apparatus for mounting a grid array device package comprising:
   (a) a base member having a contact side and an interconnection side;
   (b) a retaining member having a face substantially parallel with and spaced from the contact side of said base member; and
   (c) an array of elongated contact pins passing through said base member, each having a contact end, an interconnect end, an implanted portion within the base member and a free portion extending from the contact side of the base member to said contact end, said pins each having a bend substantially defining the boundary between said implanted portion and said free portion, said implanted portion having sufficient surface area of contact with said base member to prevent significant transmission of stress to said interconnect end.

31. Apparatus as defined in claim 30 wherein said retaining member leaves uncovered at least 75% of one major face of a grid array device package mounted therein.

32. Apparatus as defined in claim 30 wherein the boundary-defining bend defines an angle with respect to said contact side of said base member greater than 15° and less than 65°.

33. Apparatus as defined in claim 30 wherein the boundary-defining bend defines an angle with respect to said contact side of said base member small enough to prevent the contact pin from sliding off the terminal it contacts when moving to accommodate mounting of a grid array device package therein.

34. Apparatus as defined in claim 30 wherein the boundary-defining bend defines an angle with respect to said contact side of said base member large enough to compensate for various thicknesses of grid array device packages mounted therein while still providing the minimum force required to retain the grid array device package against said retaining member.

35. Apparatus as defined in claim 30 wherein the free portion of each contact pin has a secondary bend between the boundary-defining bend and the contact end which defines an angle approximately equal to the angle of the boundary-defining bend.

36. Apparatus as defined in claim 30 wherein the length of the implanted portion of each contact pin is at least 25% of the total length of the pin.

37. Apparatus as defined in claim 30 wherein the interconnect end of each contact has an enlarged head.

38. Apparatus as defined in claim 30 wherein said contact pins pass through corresponding pre-formed apertures in said base member which are initially approximately the same size as or smaller than said contact pins prior to insertion of said contact pins therein.

39. Apparatus as defined in claim 38 wherein said apertures have beveled entrances on said interconnection side of said base member.

40. Apparatus as defined in claim 38 wherein said apertures have entrances on said interconnection side which are not simple right angles of the same profile size as the primary portion of the apertures passing through said base member.

41. Apparatus as defined in claim 38 wherein said apertures have beveled exits on said contact side of said base member.

42. Apparatus as defined in claim 38 wherein said apertures have exits on said contact side which have a profile different from the primary portion of the apertures passing through said base member.

43. Apparatus for mounting a grid array device package comprising:

(a) a top opening for insertion of a grid array device package therein;

(b) a base member having a contact side and an interconnection side;

(c) a retaining member having a face substantially parallel with and spaced from the contact side of said base member; and (d) an array of elongated contact pins passing through said base member, each having a contact end, an interconnect end, an implanted portion within the base member, and a free portion extending from the contact side of the base member to said contact end, said pins having a bend substantially defining the boundary between said implanted portion and said free portion, said implanted portion having at least one spur contacting said base member and approximately maintaining the position of said implanted contact pin with respect to said base member.

44. Apparatus as defined in claim 43 wherein said apparatus for mounting leaves at least 75% of one major face of a grid array device package mounted therein uncovered and exposed through said top opening.

45. Apparatus as defined in claim 43 wherein said apparatus for mounting leaves uncovered all of one major face of a grid array device package mounted therein.

46. Apparatus as defined in claim 43 wherein the boundary-defining bend defines an angle with respect to said contact side of said base member greater than 15° and less than 65°.

47. Apparatus as defined in claim 43 wherein said face of said retaining member is positioned between said contact side of the base member and the top opening of the mounting apparatus to limit the depth of insertion of a device package into said apparatus.

48. Apparatus as defined in claim 43 wherein the boundary-defining bend defines an angle with respect to said contact side of said base member small enough to prevent said contact pin from sliding off the terminal it contacts when moving to accommodate mounting of a grid array device package therein.

49. Apparatus as defined in claim 43 wherein the length of said implanted portion of each contact pin is at least 25% of the total length of said pin.

50. Apparatus as defined in claim 43 wherein said interconnect end of each contact pin has a tail.

51. Apparatus as defined in claim 50 wherein said tail is oriented substantially parallel with and in contact with said interconnection side of said base member.

52. Apparatus as defined in claim 43 wherein said at least one spur comprises at least two spurs extending from said implanted portion, both of which spurs interact with said base member to maintain the position of said contact pin with respect to said base member.

53. Apparatus as defined in claim 52 wherein each contact pin passes through a corresponding pre-existing aperture in said base member which defines a profile designed to interact with said at least two spurs and maintain the position of the contact pin with respect to said base member.

54. Apparatus as defined in claim 53 wherein said aperture and said at least two spurs are configured to allow said contact pin to be snapped into place by insertion through said aperture.

55. Apparatus as defined in claim 54 wherein said contact pin comprises a section of ribbon stock defining two sides and two edges.

56. Apparatus as defined in claim 55 wherein said at least two spurs are configured on said contact pin such that at least one spur extends from each of said sides of said pin.

57. Apparatus as defined in claim 43 wherein said at least one spur is further positioned to prevent significant transmission of stress to said interconnect end.

58. Apparatus as defined in claim 54 wherein said at least two spurs are further positioned to prevent significant transmission of stress to said interconnect end.

* * * * *